United States Patent
Abeywickrama

(10) Patent No.: US 10,345,366 B2
(45) Date of Patent: Jul. 9, 2019

(54) METHOD FOR MONITORING TRANSFORMER BUSHINGS AND A SYSTEM THEREFOR

(71) Applicant: ABB Schweiz AG, Baden (CH)

(72) Inventor: Nilanga Abeywickrama, Västerås (SE)

(73) Assignee: ABB Schweiz AG, Baden (SE)

( * ) Notice: Subject to any disclaimer, the term of this patent is extended or adjusted under 35 U.S.C. 154(b) by 0 days.

(21) Appl. No.: 15/559,317

(22) PCT Filed: Mar. 17, 2016

(86) PCT No.: PCT/EP2016/055896
§ 371 (c)(1),
(2) Date: Sep. 18, 2017

(87) PCT Pub. No.: WO2016/146794
PCT Pub. Date: Sep. 22, 2016

(65) Prior Publication Data
US 2018/0113164 A1   Apr. 26, 2018

(30) Foreign Application Priority Data
Mar. 17, 2015 (EP) .................... 15159464

(51) Int. Cl.
 *G01R 31/12* (2006.01)
 *G01R 27/26* (2006.01)
 *G01R 31/02* (2006.01)
(52) U.S. Cl.
 CPC ..... *G01R 31/1245* (2013.01); *G01R 27/2688* (2013.01); *G01R 27/2694* (2013.01); *G01R 31/027* (2013.01)
(58) Field of Classification Search
 CPC ............. G01R 31/1245; G01R 31/027; G01R 27/2688–27/2694

(Continued)

(56) References Cited

U.S. PATENT DOCUMENTS

| 4,757,263 A | 7/1988 | Cummings, III et al. |
| 6,678,139 B1 * | 1/2004 | Greuter ............. H02G 15/06 361/117 |

(Continued)

FOREIGN PATENT DOCUMENTS

WO    2008113142 A2    9/2008

OTHER PUBLICATIONS

Allan D M et al: "A Continuous Insulation Monitor for High Voltage Transformer Bushings", International Symposium on High Voltage Engineering, XX, XX, vol. 7, Aug. 26, 1991 (Aug. 26, 1991) pp. 119-122; 4 pages XP000647062.

(Continued)

*Primary Examiner* — Patrick Assouad
*Assistant Examiner* — Demetrius R Pretlow
(74) *Attorney, Agent, or Firm* — Whitmyer IP Group LLC

(57) ABSTRACT

A system for monitoring transformer bushings sensors, wherein first and second bushing sensors are connected to a common first phase of a high voltage source, and the third and fourth bushing sensors are connected to a common second phase of the high voltage source. A first time series is generated from the first and second bushing sensors during a predetermined time interval. A second time series, is generated from the third and fourth bushing sensors during the predetermined time interval. A correlation model for the first and second time series for determining a difference between a measured signal and an estimated signal, and generating a signal indicative of a bushing problem the difference is larger than a threshold.

20 Claims, 7 Drawing Sheets

(58) Field of Classification Search
USPC .......................................................... 324/547
See application file for complete search history.

(56) References Cited

U.S. PATENT DOCUMENTS

| | | | | |
|---|---|---|---|---|
| 6,809,525 | B1* | 10/2004 | Sampat | G01R 31/027 324/546 |
| 8,907,223 | B2* | 12/2014 | Johansson | H01B 17/28 174/143 |
| 9,128,477 | B2* | 9/2015 | Stenestam | G05B 19/0428 |
| 2003/0160602 | A1* | 8/2003 | Anand | G01R 27/2688 324/126 |
| 2010/0097076 | A1* | 4/2010 | Santos | G01R 31/1245 324/658 |
| 2011/0031980 | A1* | 2/2011 | Kruger | G01R 31/027 324/547 |
| 2011/0301880 | A1* | 12/2011 | Stenestam | G05B 19/0428 702/50 |
| 2012/0036677 | A1* | 2/2012 | Chung | H01H 33/26 16/2.1 |
| 2013/0018620 | A1* | 1/2013 | Riendeau | G01M 5/00 702/89 |
| 2014/0025211 | A1* | 1/2014 | Cheim | G05B 13/02 700/286 |
| 2014/0125351 | A1* | 5/2014 | Woodward, Jr. | G01R 31/027 324/537 |
| 2014/0368215 | A1* | 12/2014 | Hoffman | G01R 15/16 324/552 |
| 2016/0154051 | A1* | 6/2016 | Watson | G01R 31/1245 324/552 |
| 2016/0202303 | A1* | 7/2016 | Costa i Bricha | G01R 31/02 702/58 |
| 2016/0252564 | A1* | 9/2016 | Wu | G01R 31/1263 324/552 |

OTHER PUBLICATIONS

EP Search Report Application No. DE 15159464.5 dated Aug. 21, 2015; Mailing Date: Aug. 31, 2015 8 pages.

International Search Report & Written Opinion of the International Searching Authority Application No. PCT/EP2016/055896 dated May 12, 2016; Mailing Date: May 24, 2016 15 pages.

Berler Z et al: "On-line monitoring of HV bushings and current transformers", Electrical Insulation Conference and Electrical Manufacturing Expo, 20 05. Proceedings Indianapolis, IN, USA Oct. 23-26, 2005, Piscataway, NJ, USA,IEEE, Oct. 23, 2005 (Oct. 23, 2005), pp. 61-66; 6 pages XP010870960, ISBN: 978-0-7803-9145-1.

Riendeau S et al: "On-line monitoring of transformer bushings using a new decentralized measurement system", Electrical Insulation (ISEI), Conference Record of the 2010 IEEE International Symposium on, IEEE, Piscataway, NJ, USA, Jun. 6, 2010 (Jun. 6, 2010) pp. 1-5; 5 pages XP031733770,ISBN: 978-1-4244-6298-8.

* cited by examiner

METHOD FOR MONITORING TRANSFORMER BUSHINGS AND A SYSTEM THEREFOR

TECHNICAL FIELD

The present invention relates to a method for monitoring transformer bushings, the present invention further relates to a system for monitoring transformer bushings.

BACKGROUND

One of the most error prone components of a modern high voltage transformer is the transformer bushings. The transformer bushing relays the incoming high voltage to the windings of the transformer while providing electrical insulation. A common type of transformer bushing has a center conductor with wrapped layers of insulating oil impregnated paper arranged within a porcelain body. For testing and monitoring purposes the transformer bushing often comprises a bushing tap adaptor. The bushing tap adaptor is connected to one of the oil impregnated paper layers such that a fraction of the high voltage feeding the center conductor becomes accessible through the bushing tap adaptor. The bushing tap adaptor is configured to receive a bushing sensor.

The transformer bushing must withstand high electrical fields, large temperature differences, as well as high humidity.

These harsh conditions often cause transformer bushings to fail and problems related to transformer bushings are responsible for a significant portion of all transformer related errors. The transformer bushing errors that occur are usually related to the condition of the bushing insulation.

It is therefore important to monitor the condition of the insulator in the transformer bushing. A first method to assess the condition of the insulator involves estimating the loss tangent and capacitance by means of comparing the voltage measured at the bushing tap adaptor with a reference voltage obtained from the same high voltage source, as described in U.S. Pat. No. 4,757,263. This method requires a separate connection to the high voltage source through for example an instrument transformer.

A second method commonly used for monitoring transformer bushings is the sum-of-current method. This method involves summing the currents from each bushing test tap for three phases; the sum is then relayed to a null meter, which detects differences in the sum-of-currents.

A third method currently used is illustrated in FIG. 2. This method involves relative measurements of a loss tangent and a relative amplitude between two bushings connected to the same phase but different transformers.

Hence, there exist a need for an improved method and system for monitoring transformer bushings that circumvent the above outlined problems and shortcomings.

SUMMARY

One or more of the above objects, and further possible objects that can be construed from the disclosure below, are met by a first aspect of the invention constituted by a method for monitoring transformer bushings, comprising: recording time series comprising information from a first bushing sensor, a second bushing sensor, a third bushing sensor, and a fourth bushing sensor, wherein the first bushing sensor and the second bushing sensor are connected to a common first phase of a high voltage source, and the third bushing sensor and the fourth bushing sensor are connected to a common second phase of the high voltage source. The method further comprises generating a first time series comprising information from the first bushing sensor and the second bushing sensor during a predetermined time interval, and generating a second time series, substantially simultaneously with the first time series, comprising information from the third bushing sensor and the fourth bushing sensor during the predetermined time. The method comprises generating a correlation model for the first time series and the second time series. The method further comprises measuring a first signal corresponding to a measurement of the first time series, and measuring a second signal corresponding to a measurement of the second time series. The method comprises determining a difference between the measured first signal or the measured second signal, and an estimated first signal or an estimated second signal being estimated by means of the correlation model and the measured first or second signal, and generating a signal indicative of a bushing problem if it is determined that the determined difference is larger than a predetermined threshold value.

This has the effect that the temperature compensations of the bushing parameters becomes unnecessary, which means that temperature sensors in the bushing test adaptors no longer is needed.

The above objects and further possible objects are further met by a second aspect of the invention constituted by a system for monitoring transformer bushings, comprising a recording system for recording time series comprising information from a first bushing sensor, a second bushing sensor, a third bushing sensor, and a fourth bushing sensor, wherein the first bushing sensor and the second bushing sensor are connected to a common first phase of a high voltage source, and the third bushing sensor and the fourth bushing sensor are connected to a common second phase of the high voltage source. The system further comprises means for generating a first time series comprising information from the first bushing sensor and the second bushing sensor during a predetermined time interval, and means for generating a second time series, substantially simultaneously with the first time series, comprising information from the third bushing sensor and the fourth bushing sensor during the predetermined time interval. The system comprises means for generating a correlation model for the first time series and the second time series. The system comprises means for measuring a first signal corresponding to a measurement of the first time series, and means for measuring a second signal corresponding to a measurement of the second time series. The system also comprises means for determining a difference between the measured first signal or the measured second signal, and an estimated first signal or an estimated second signal being estimated by means of the correlation model and the measured first or second signal. The system also comprises means for generating a signal indicative of a bushing problem if it is determined that the determined difference is larger than a predetermined threshold value.

Additional or alternative features of the first aspect are described below.

The step of generating the correlation model may involve calculating a relative loss tangent. This allows a comparison to be made of losses in the bushings.

The relative loss tangent of the first time series may be correlated to the relative loss tangent of the second time series. This allows a correlation model for the losses between two phases to be determined.

The step of generating the correlation model may involve calculating a relative amplitude ratio for each of the first time series and the second time series. The relative amplitude ratio allows a simple calculation of the losses.

The relative amplitude ratio of the first time series may be correlated to the relative amplitude of the second time series. This allows a simple correlation model to be calculated.

The first bushing sensor and the third bushing sensor may be connected to a first transformer, and the second bushing sensor and the fourth bushing sensor may be connected to a second transformer. This allows inter-phase comparisons to be made between the first transformer and the second transformer.

The first transformer and the second transformer may be provided in the same substation. This has the effect that the first transformer and the second transformer have similar environmental surroundings. This means that the transformer bushings should exhibit similar characteristics if they are of the same type and are connected to similar transformers. This will result in an almost ideal correlation being close to one.

The correlation model may be generated by means of a regression model. This allows an easy comparison between the correlation model and measurements.

The regression model may be a linear regression model. This type of model is easy to fit using historical bushing data.

Below, alternative or additional features of the second aspect are presented.

The first bushing sensor and the third bushing sensor are connected to a first transformer; the second bushing sensor and the fourth bushing sensor are connected to a second transformer.

The first transformer and the second transformer are provided in the same substation. This has the effect that the first transformer and the second transformer have similar environmental surroundings. This means that the transformer bushings will exhibit similar characteristics if they are of the same type and are connected to similar transformers. This will result in an almost ideal correlation close to one.

The recording system may comprise a first recording device connected to the first bushing sensor and the third bushing sensor, and a second recording device connected to the second bushing sensor and to the fourth bushing sensor.

Alternatively, the recording system may comprise a first recording device connected to the first bushing sensor and to the second bushing sensor, and a second recording device connected to the third bushing sensor and to the fourth bushing sensor.

DETAILED DESCRIPTION

In the following detailed description embodiments of the invention will be described with reference made to the accompanying drawings.

Figure 1:
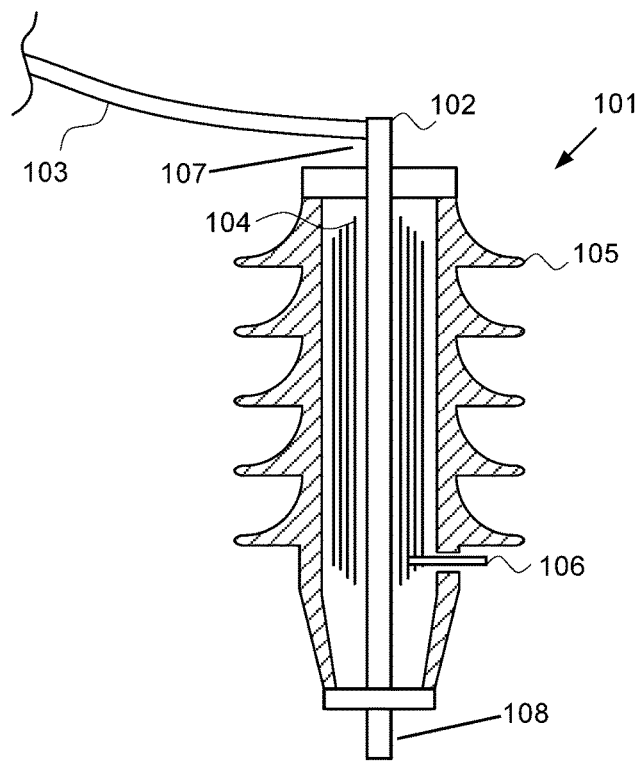
FIG. 1 is a schematic drawing of a cross section of a transformer bushing.

In FIG. 1 a conventional transformer bushing, generally designated 101, is illustrated. The transformer bushing 101 has a center conductor 102 connected at a first end 107 to a high voltage source (not shown) via a conductor 103. The center conductor 102 at a second end 108 is connected to a winding of a high voltage transformer (not shown). For insulation the center conductor 102 is wrapped with several layers of paper 104. The paper wrapping is for example made of oil impregnated paper, resin impregnated paper (RIP), or resin bonded paper (RBP). Outside the paper wrapping 104 an insulator 105 of porcelain is arranged. In order to perform measurements of the high voltage with a bushing sensor 106 a bushing tap adaptor is arranged through the insulator 105 and through the outer paper wrappings 104 such that a fraction of the high voltage is provided to the bushing sensor 106.

Figure 2:
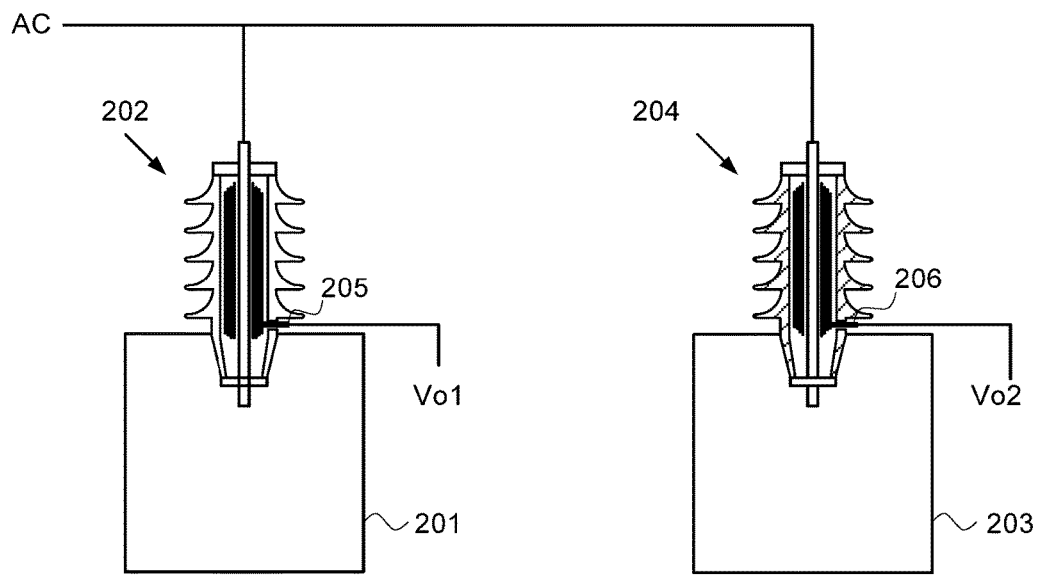
FIG. 2 is a schematic drawing of two transformers connected to a common high voltage source through respective bushings.

In FIG. 2 a phase AC from a high voltage source (not shown) is connected to a first transformer 201 having a first transformer bushing 202 and to a second transformer 203 having a second bushing 204. Thus the transformer bushings 202,204 share the same phase AC. From a first transformer bushing sensor 205 a first voltage Vo1 and a first phase $\alpha 1$ is available and from a second transformer bushing sensor 206 a second voltage Vo2 and a second phase $\alpha 2$ is available. Even though these voltages and phases come from the same phase of the same high voltage source they are not identical due to differences in the impedances of the first transformer bushing and the second transformer bushing. The difference in impedance can be attributed to different surroundings of the transformer bushings, such as temperature or moisture. The difference in impedance can also be due to leakages in the insulation of the transformer bushing or moisture in the oil of the transformer bushing. The first phase $\alpha 1$ can be written as:

$$\alpha 1 = \alpha 0 + \delta 1 \tag{eq1}$$

where $\alpha 0$ is the phase angle of the first phase and $\delta 1$ is the loss tangent of the first transformer bushing. A corresponding reasoning can be performed for the second phase, which yields:

$$\alpha 2 = \alpha 0 + \delta 2 \tag{eq2}$$

where $\alpha 0$ is the phase angle of the second phase and $\delta 2$ is the loss tangent for the second transformer bushing.

By calculating the tangent of the difference between $\alpha 1$ and $\alpha 2$ a value for the differential loss tangent can be calculated as follows:

$$\tan(\alpha 1 - \alpha 2) = \tan(\alpha 0 + \delta 1 - \alpha 0 - \delta 2) = \tan(\delta 1 - \delta 2) \approx \tan(\delta 1) - \tan(\delta 2) \approx \Delta \tan \delta \tag{eq3}$$

This equation (eq3) gives an expression for the relative loss tangent $\Delta \tan \delta$ for a combination of two transformer bushing sensors.

Another useful parameter to calculate is the relative amplitude ratio of the voltage Vo1 and Vo2:

$$RA = |Vo1/Vo2| \tag{eq4}$$

The voltage ratio RA is proportional to the capacitances of the first and the second bushing.

Figure 3:
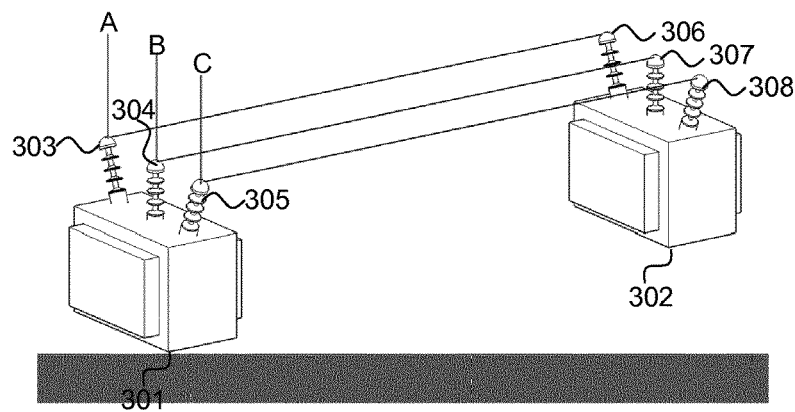
FIG. 3 is a schematic drawing of two three phase power transformers, each having three transformer bushings.

Now with reference made to FIG. 3 an embodiment with two parallel high voltage transformers will be discussed. In FIG. 3 is a first three phase transformer 301 connected to a three phase high voltage source (not shown) having three phases A, B and C through respective transformer bushings 303-305. A second three phase transformer 302 is connected to the high voltage source via respective transformer bushings 306-308. A first bushing sensor is arranged in the first transformer bushing 303, second bushing sensor is arranged in the second transformer bushing 304, a third bushing sensor is arranged in the third transformer bushing 305. Corresponding fourth, fifth and sixth bushing sensors are arranged in the transformer bushings 306-308 of the second three phase transformer 302.

The relative loss tangent for the first phase A $\Delta \tan \delta(A)$ can be calculated using the phase for the bushing sensor arranged in the first transformer bushing 303 and for the bushing sensor arranged in the fourth transformer bushing 306 and equation (eq3).

The corresponding relative amplitude ratio RA(A) can also be calculated for the first phase A using equation (eq4).

Furthermore, the relative loss tangent for the second phase B $\Delta \tan \delta(B)$ can be calculated using the phase for the bushing sensor arranged in the second transformer bushing 304 and for the bushing sensor arranged in the fifth transformer bushing 307.

A corresponding relative amplitude ratio RA(B) can also be calculated for the second phase B.

For the third phase C a corresponding loss tangent $\Delta \tan \delta(C)$ and relative amplitude ratio RA(C) can be calculated.

If the calculated loss tangents and relative amplitudes was recorded in corresponding time series, a correlation model between the different phases A, B and C can be determined.

For example, when $\Delta \tan \delta(A)$ is correlated to $\Delta \tan \delta(B)$, then if the transformer bushings are identical the correlation model will be a straight line through zero with a slope of one.

The difference between a measured $\Delta \tan \delta$ and an estimated $\Delta \tan \delta$ (by means of the correlation model) indicates the distance to the estimated value from the correlation model. If the difference is larger than a predetermined threshold value a transformer bushing problem might exist and a suitable warning signal may be generated.

By determining the correlation model between the phases i.e. correlation($\Delta \tan \delta(A)$, $\Delta \tan \delta(B)$), correlation($\Delta \tan \delta(A)$, $\Delta \tan \delta(C)$), and correlation($\Delta \tan \delta(B)$, $\Delta \tan \delta(C)$) for the relative loss tangent the failing pair of transformer bushing is easily identified.

Furthermore, the correlation model for the relative amplitudes can also be determined, i.e. correlation(RA(A), RA(B)), correlation(RA(B), RA(C)), and correlation(RA(A), RA(C)).

Figure 4:
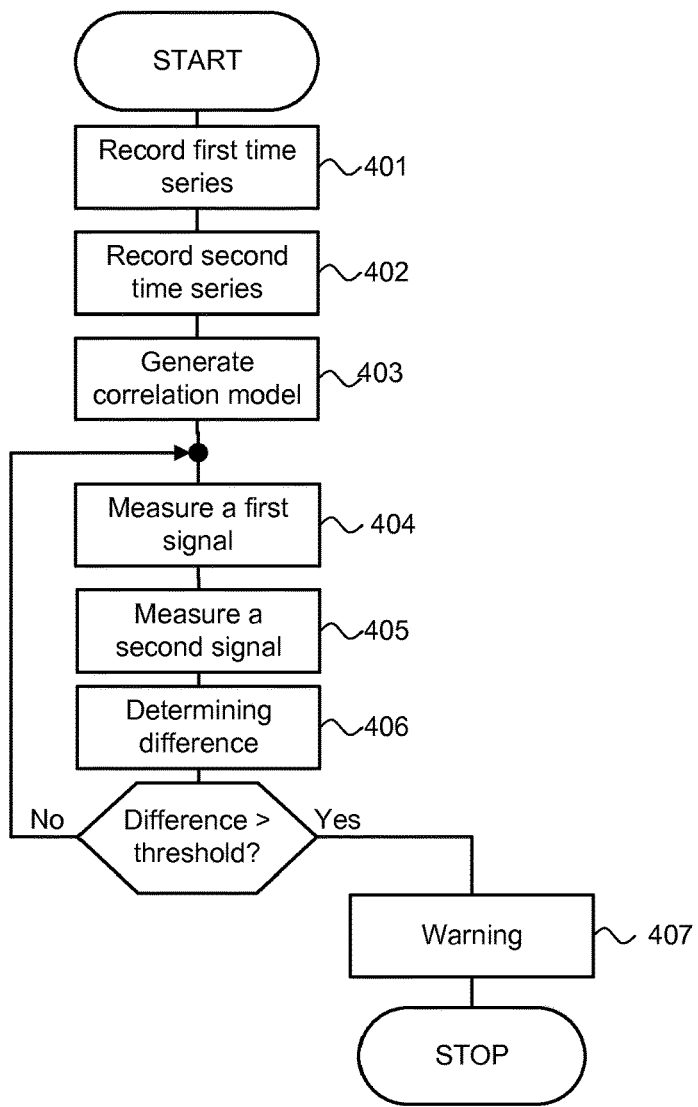
FIG. 4 is a flow diagram illustrating a method for monitoring transformer bushings.

In FIG. 4 an embodiment of a method for monitoring transformer bushings is disclosed, the method involves the steps of:

401: Record a first time series comprising information from a first bushing sensor and a second bushing sensor, each connected to a common first phase of an electrical source.

402: Record a second time series, substantially simultaneously with the first time series, comprising information from a third bushing sensor and a fourth bushing sensor each connected to a common second phase of the electrical source, different from the first phase.

403: Generating a correlation model for the first time series and the second time series.

404: Measuring a first signal corresponding to a measurement of the first time series.

405: Measuring a second signal corresponding to a measurement of the second time series.

406: Determining a difference between the measured first signal, or the measured second signal, and an estimated first signal, or an estimated second signal, being estimated by means of the correlation model and the measured first or second signal.

The step 406 may in one embodiment comprise determining a difference between the measured first signal and an estimated first signal, or determining a difference between the measured second signal and an estimated second signal. The estimated first signal is estimated by means of the correlation model and a measured second signal. The estimated second signal is estimated by means of the correlation model and a measured first signal. 407: Generating a signal indicative of a bushing problem if it is determined that the determined difference is larger than a predetermined threshold value.

The predetermined threshold value may be a number of standard deviations calculated for a normal spread of the information from a bushing sensor.

The generated signal may for example be a visual signal, an audio signal or a digital signal.

In order to further elucidate the beneficial features of the invention a series of experiment will be disclosed.

In this series of experiment a first three phase transformer T1 is connected to phase 1, 2 and 3 of a high voltage source through respective transformer bushings. The first transformer T1 is provided in a substation together with a second three phase transformer T2. The second transformer T2 is connected to the same phases 1, 2 and 3 as the first transformer through respective transformer bushings. Each of the transformer bushings in the first and second transformer is provided with bushing sensors connected to corresponding recording devices, such that $\Delta \tan \delta$ and RA are easily calculated by means of the recorded voltages and phases through the bushing sensors and equation (eq3) and (eq4).

Figure 5:
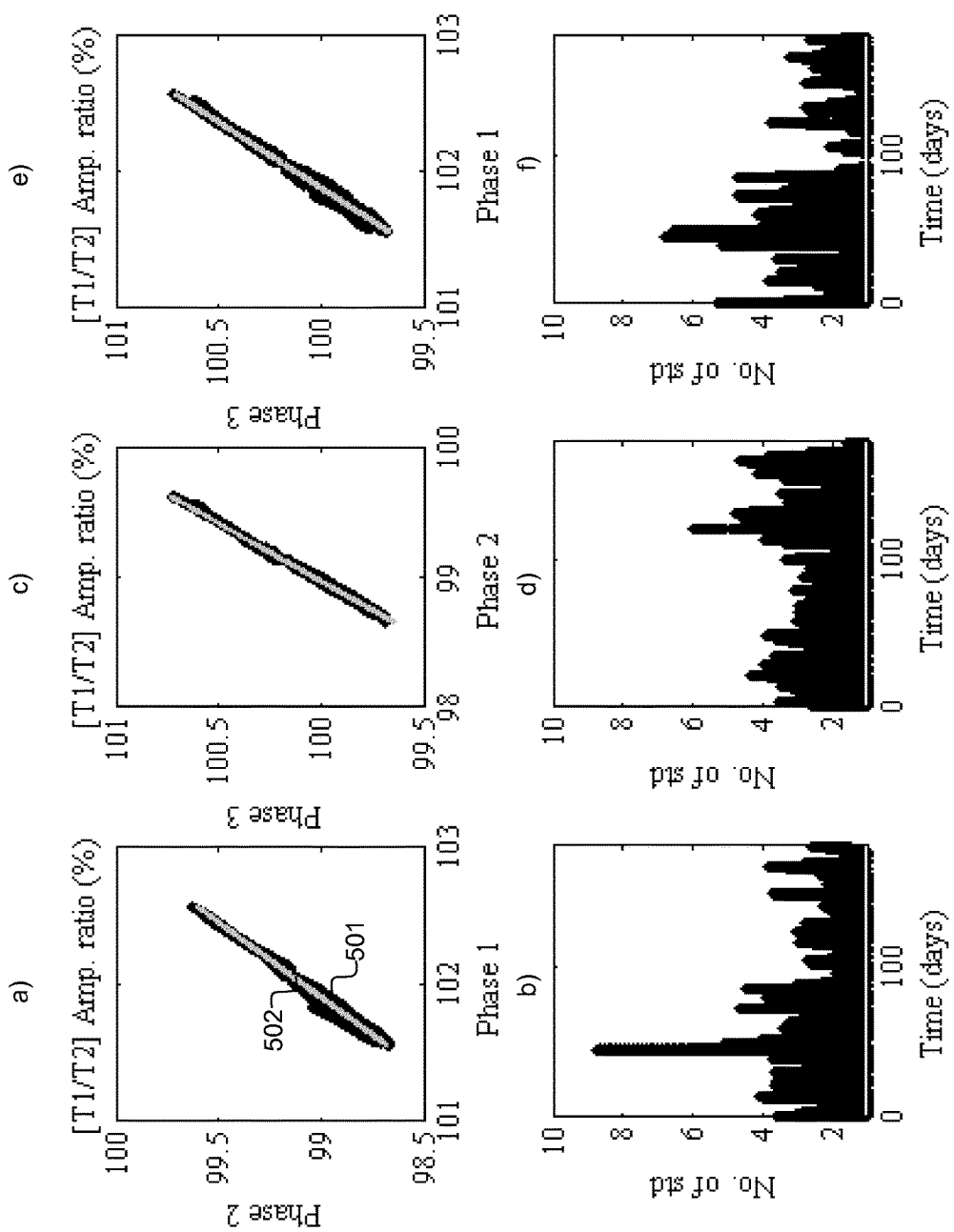
FIG. 5 is a plot illustrating the correlation of relative amplitudes between two pairs of transformer bushings.

The result of a first experiment is illustrated in FIG. 5a)-5f).

In FIG. 5a) the relative amplitude RA of the phase 1 RA(1) is plotted against the relative amplitude RA of the phase 2 RA(2) in a series 501. For the correlation between RA(1) and RA(2) a linear regression model is fitted with historical data which yields a correlation model 502. The deviation between the correlation model 502 and the series 501 is plotted as deviations in numbers of standard deviation versus time in FIG. 5b). These plots illustrate correlations between healthy transformer bushings.

A corresponding pair of plots illustrating the correlation between phase 3 and phase 2 are illustrated in FIGS. 5c) and 5d).

And finally in FIGS. 5e) and 5f), the correlation between phase 1 and phase 3 are illustrated.

The correlation between the phases illustrated in FIG. 5a)-5f) illustrates typical relations for transformer bushings of the same type connected to similar first and second transformers T1 and T2.

Figure 6:
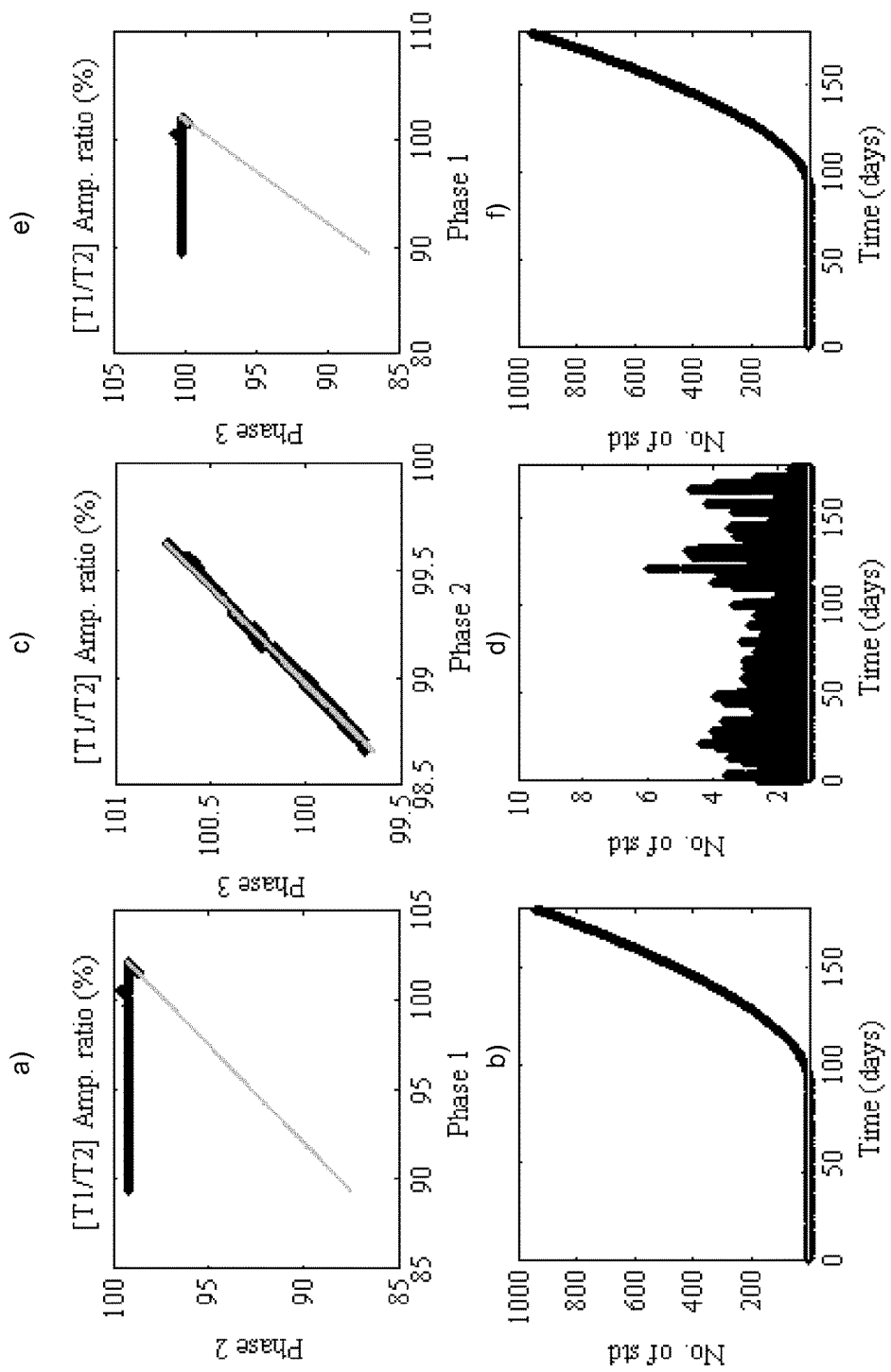
FIG. 6 is a plot illustrating the correlation of relative amplitudes between two pairs of transformer bushings.

FIGS. 6a)-6f) illustrates the relative amplitude correlation between phase 1, 2 and 3 of the first transformer T1 and the second transformer T2. In FIGS. 6c) and 6d) a healthy correlation can be observed, but in both FIGS. 6a) and 6b) and FIGS. 6e) and 6f) a large deviation can be identified for phase 1, which indicates a transformer bushing problem in either the transformer bushing for phase 1 of the first transformer or in the transformer bushing for phase 1 of the second transformer.

Figure 7:
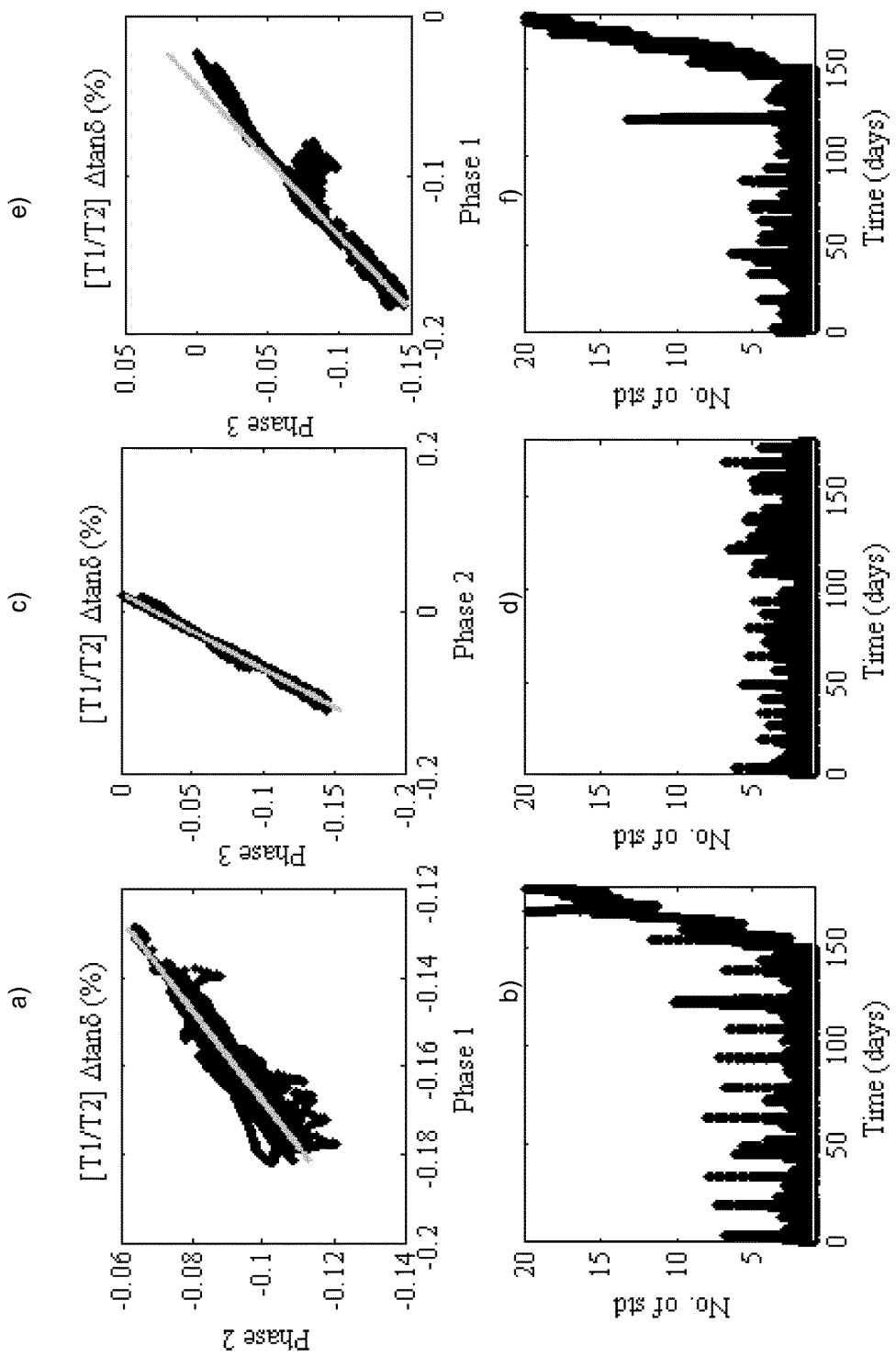
FIG. 7 is a plot illustrating the correlation of relative loss tangents between two pairs of transformer bushings.

In FIG. 7a)-f) is the correlation for the relative loss tangent Δ tan δ illustrated for phase 1, 2 and 3. Also in these figures can a problem of phase 1 be identified by means of deduction.

In one embodiment the correlation model of the relative amplitude and the relative loss tangent between phases is generated by means of a regression model. The regression model may be a linear regression model but other types of regression models are of course possible. It is also possible to use other techniques such as cluster identification, pattern recognition, and neural networks.

Figure 8:
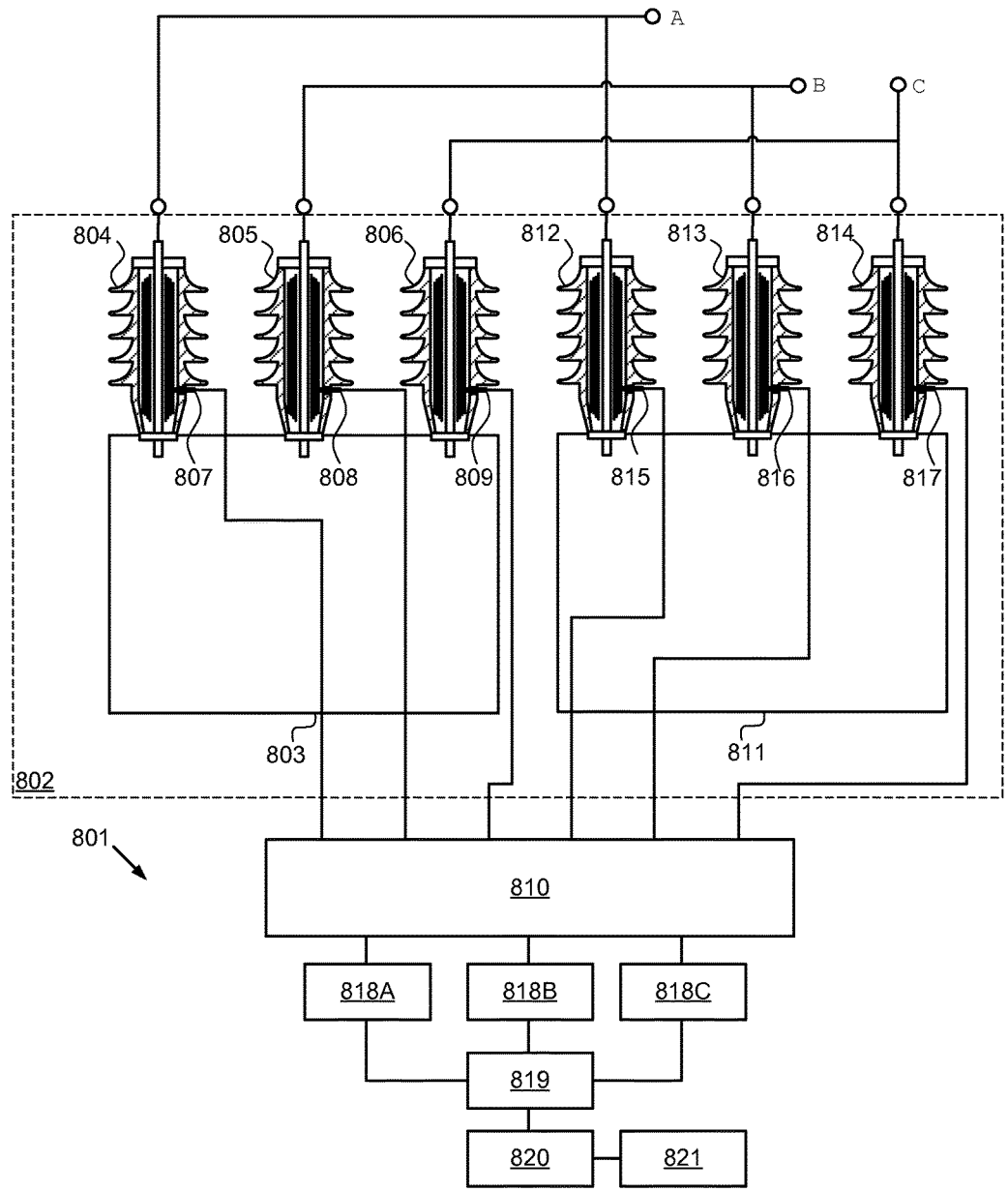
FIG. 8 is a schematic drawing of an embodiment of a monitoring system according to the invention.
Figure 9:
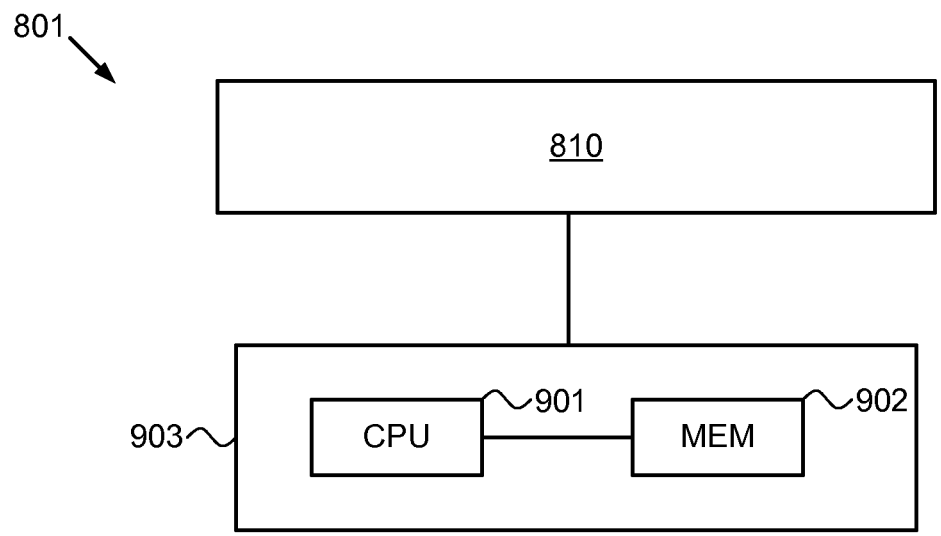
FIG. 9 is a schematic drawing of an embodiment of a monitoring device according to the invention.

In FIG. 8 an embodiment of a system according to the invention for monitoring transformer bushings, generally designated 801, is illustrated. The system 801 is connected to a power substation 802. The substation has a first three phase transformer 803 having three transformer bushings 804-806 connected to respective phases A, B and C of a high voltage source (not shown). Each of the transformer bushings 804-806 has a corresponding bushing sensor which is connected to a recording system 810 of the monitoring system 801. The power station 802 further comprises a second three phase transformer 811 connected to the three phases A, B and C of the high voltage source through respective transformer bushings 812-814. Each of the transformer bushings 812-814 has a bushing sensor 815-817 connected to the recording system 810.

The monitoring system 801 further comprises means 818A for generating a first time series comprising information from the bushing sensor 807 and the bushing sensor 815 for the first phase A, during the predetermined time interval.

The monitoring system 801 further comprises means 818B for generating a second time series comprising information from the bushing sensor 808 and the bushing sensor 816 for the second phase B, during the predetermined time interval.

The monitoring system 801 further comprises means 818C for generating a third time series comprising information from the bushing sensor 809 and the bushing sensor 817 for the third phase C, during the predetermined time interval.

The monitoring system 801 further comprises a correlation device 819 for generating correlation models between the first time series, the second time series, and the third time series.

The recording system 810 further comprises means for measuring a first signal corresponding to a measurement of the first time series;

The recording system 810 further comprises means for measuring a second signal corresponding to a measurement of the second time series;

The recording system 810 further comprises means for measuring a third signal corresponding to a measurement of the third time series;

The monitoring system 801 further comprises means for determining a difference 820 between the measured first signal or the measured second signal, and an estimated first signal or an estimated second signal being estimated by means of the correlation device and the measured first or second signal;

The monitoring system 801 further comprises means for generating a signal 821 indicative of a bushing problem if it is determined that the determined difference is larger than a predetermined threshold value.

The means for determining a difference 820 is in one embodiment configured to determine the difference between the measured first signal and an estimated first signal, or to determine the difference between the measured second signal and an estimated second signal. The estimated first signal is estimated by means of the correlation model and a measured second signal, and the estimated second signal is estimated by means of the correlation model and a measured first signal.

The correlation model may be a regression model fitted to historical time series for the transformer bushings. The regression model may in some embodiments be a linear regression model. But of course other models might be used such as pattern recognition, cluster analysis, neural networks etc.

In other embodiments, the recording system 810 may comprise a first recording device connected to a bushing sensor 807 and to the bushing sensor 815. The recording system 810 may further comprise a second recording device connected to the bushing sensor 808 and to the bushing sensor 816.

In another embodiment of the recording system 810, the recording system may comprise a first recording device connected to the bushing sensor 807 and to the bushing sensor 808, and a second recording device connected to the bushing sensor 815 and to the bushing sensor 816.

In another embodiment of the system the recording device 810 may be connected to a computer 903 having a processor 901 with memory 902, wherein the memory comprises instructions for the processor, when executed by the processor, cause the processor to perform a method as set out hereinabove.

The above mentioned and described embodiments are only given as examples and should not be limiting. Other solutions, uses, objectives, and functions within the scope of the accompanying patent claims may be possible.

The invention claimed is:

1. A system for monitoring transformer bushings, comprising:
at least four bushing sensors connectable to bushing tap adaptors of at least two transformers, a first bushing sensor and a second bushing sensor being connected to a common first phase of a high voltage source at a first transformer and a second transformer respectively, a third bushing sensor and a fourth bushing sensor being connected to a common second phase of the high voltage source at the first transformer and the second transformer respectively;
each bushing sensor generating a sensor signal indicative of a measured voltage and a measured phase;
a processor, wherein a first sensor signal from the first bushing sensor, a second sensor signal from the second bushing sensor, a third sensor signal from the third bushing sensor, and a fourth sensor signal from the fourth bushing sensor are accessible by the processor;
the processor generating a first data including information from the first and second sensor signals during a predetermined time interval, and generating a second data, substantially simultaneously with the first data, including information from the third and fourth sensor signals during the predetermined time interval;
the processor providing inter-phase comparison between the first transformer and the second transformer by generating a correlation model from the first data and the second data, the processor being configured to:

obtain a first measure corresponding to a measurement in the first data and a second measure corresponding to a measurement in the second data, calculate a first estimate using the correlation model and the second measure, or a second estimate using the correlation model and the first measure, and determine a difference between the first measure and the first estimate or between the second measure and the second estimate;

the processor generating a signal indicative of a bushing problem when the difference is larger than a predetermined threshold value.

2. The system according to claim 1, wherein the signal indicates one of the common first phase or the common second phase as having the bushing problem, the signal being used to identify the respective transformer bushings connected to said one of the common first phase or the common second phase for repair or replacement.

3. The system according to claim 1, wherein the processor calculates relative loss tangents in generating the correlation model.

4. The system according to claim 3, wherein the processor:

calculates a first relative loss tangent for the common first phase using the measured phase of the first sensor signal in the first data and the measured phase of the second sensor signal in the first data;

calculates a second relative loss tangent for the common second phase using the measured phase of the third sensor signal in the second data and the measured phase of the fourth sensor signal in the second data; and generates the correlation model by correlating the first relative loss tangent to the second relative loss tangent.

5. The system according to claim 4, wherein the first measure obtained by the processor is the first relative loss tangent and the second measure obtained by the processor is the second relative loss tangent; and wherein the first estimate is calculated by the processor using the correlation model and the second relative loss tangent, or the second estimate is calculated by the processor using the correlation model and the first relative loss tangent.

6. The system according to claim 1, wherein the processor calculates relative amplitude ratios in generating the correlation model.

7. The system according to claim 6, wherein the processor:

calculates a first relative amplitude ratio for the common first phase using the measured voltage of the first sensor signal in the first data and the measured voltage of the second sensor signal in the first data;

calculates a second relative amplitude ratio for the common second phase using the measured voltage of the third sensor signal in the second data and the measured voltage of the fourth sensor signal in the second data; and generates the correlation model by correlating the first relative amplitude ratio to the second relative amplitude ratio.

8. The system according to claim 7, wherein the first measure obtained by the processor is the first relative amplitude ratio and the second measure obtained by the processor is the second relative amplitude ratio; and wherein the first estimate is calculated by the processor using the correlation model and the second relative amplitude ratio, or the second estimate is calculated by the processor using the correlation model and the first relative amplitude ratio.

9. The system according to claim 1, wherein the first transformer and the second transformer are provided in the same substation.

10. The system according to claim 1, wherein the correlation model generated by the processor is a regression model.

11. The system according to claim 10, wherein the regression model is a linear regression model.

12. A method of monitoring transformer bushings, comprising:

connecting at least four bushing sensors to bushing tap adaptors of at least two transformers, a first bushing sensor and a second bushing sensor being connected to a common first phase of a high voltage source at a first transformer and a second transformer respectively, a third bushing sensor and a fourth bushing sensor being connected to a common second phase of the high voltage source at the first transformer and the second transformer respectively, each bushing sensor generates a sensor signal indicative of a measured voltage and a measured phase;

sending a first sensor signal from the first bushing sensor, a second sensor signal from the second bushing sensor, a third sensor signal from the third bushing sensor, and a fourth sensor signal from the fourth bushing sensor to a processor;

generating a first data which includes information from the first and second sensor signals during a predetermined time interval and generating, substantially simultaneously with the first data, a second data which includes information from the third and fourth sensor signals during the predetermined time interval;

providing inter-phase comparison between the first transformer and the second transformer by generating a correlation model from the first data and the second data with the processor;

obtaining a first measure corresponding to a measurement in the first data and obtaining a second measure corresponding to a measurement in the second data;

calculating a first estimate using the correlation model and the second measure, or a second estimate using the correlation model and the first measure;

determining a difference between the first measure and the first estimate or between the second measure and the second estimate; and generating a signal indicative of a bushing problem in response to detecting that the difference is larger than a predetermined threshold value.

13. The method according to claim 12, further comprising:

identifying the respective transformer bushings connected to one of the common first phase or the common second phase to be repaired or replaced based on said signal, wherein the signal indicates said one of the common first phase or the common second phase as having the bushing problem.

14. The method according to claim 12, wherein generating the correlation model includes calculating relative loss tangents.

15. The method according to claim 14, wherein calculating relative loss tangents includes:

calculating a first relative loss tangent for the common first phase using the measured phase of the first sensor signal in the first data and the measured phase of the second sensor signal in the first data;

calculating a second relative loss tangent for the common second phase using the measured phase of the third sensor signal in the second data and the measured phase of the fourth sensor signal in the second data; and generating the correlation model by correlating the first relative loss tangent to the second relative loss tangent.

16. The method according to claim 15, wherein the first measure obtained is the first relative loss tangent and the second measure obtained is the second relative loss tangent; and wherein calculating the first estimate or the second estimate is performed by the processor using the correlation model and the second relative loss tangent, or the correlation model and the first relative loss tangent, respectively.

17. The method according to claim 12, wherein generating the correlation model comprises calculating relative amplitude ratios.

18. The method according to claim 17, wherein calculating relative amplitude ratios includes:

calculating a first relative amplitude ratio for the common first phase using the measured voltage of the first sensor signal in the first data and the measured voltage of the second sensor signal in the first data;

calculating a second relative amplitude ratio for the common second phase using the measured voltage of the third sensor signal in the second data and the measured voltage of the fourth sensor signal in the second data; and generating the correlation model by correlating the first relative amplitude ratio to the second relative amplitude ratio.

19. The method according to claim 18, wherein the first measure obtained is the first relative amplitude ratio and the second measure obtained is the second relative amplitude ratio; and wherein calculating the first estimate or the second estimate is performed by the processor using the correlation model and the second relative amplitude ratio, or the correlation model and the first relative amplitude ratio, respectively.

20. A non-transitory computer readable medium storing computer program instructions for monitoring transformer bushings, the computer program instructions, when executed by a processor, cause the processor to perform a method including:

receiving a first sensor signal from a first bushing sensor, a second sensor signal from a second bushing sensor, a third sensor signal from a third bushing sensor, and a fourth sensor signal from a fourth bushing sensor, wherein each sensor signal is indicative of a measured voltage and a measured phase, wherein the first bushing sensor and the second bushing sensor is connected to a common first phase of a high voltage source at a first transformer and a second transformer respectively, and wherein the third bushing sensor and the fourth bushing sensor is connected to a common second phase of the high voltage source at the first transformer and the second transformer respectively;

generating a first data which includes information from the first and second sensor signals during a predetermined time interval and generating, substantially simultaneously with the first data, a second data which includes information from the third and fourth sensor signals during the predetermined time interval;

providing inter-phase comparison between the first transformer and the second transformer by generating a correlation model from the first data and the second data with the processor;

obtaining a first measure corresponding to a measurement in the first data and obtaining a second measure corresponding to a measurement in the second data;

calculating a first estimate using the correlation model and the second measure, or a second estimate using the correlation model and the first measure;

determining a difference between the first measure and the first estimate or between the second measure and the second estimate; and generating a signal indicative of a bushing problem in response to detecting that the difference is larger than a predetermined threshold value.

\* \* \* \* \*